(12) United States Patent
Dawson et al.

(10) Patent No.: US 9,458,008 B1
(45) Date of Patent: Oct. 4, 2016

(54) METHOD OF MAKING A MEMS DIE HAVING A MEMS DEVICE ON A SUSPENDED STRUCTURE

(71) Applicant: FREESCALE SEMICONDUCTOR, INC., Austin, TX (US)

(72) Inventors: Chad S. Dawson, Queen Creek, AZ (US); Fengyuan Li, Chandler, AZ (US); Ruben B. Montez, Cedar Park, TX (US); Colin B. Stevens, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/658,598

(22) Filed: Mar. 16, 2015

(51) Int. Cl.
*H01L 21/302* (2006.01)
*H01L 23/48* (2006.01)
*B81B 3/00* (2006.01)
*B81C 1/00* (2006.01)

(52) U.S. Cl.
CPC ......... *B81B 3/0072* (2013.01); *B81C 1/00666* (2013.01)

(58) Field of Classification Search
CPC .................... H01L 21/302; H01L 23/481
See application file for complete search history.

(56) References Cited

U.S. PATENT DOCUMENTS

| | | | | |
|---|---|---|---|---|
| 5,488,862 | A * | 2/1996 | Neukermans | G01C 19/5719 73/504.02 |
| 5,770,883 | A * | 6/1998 | Mizuno | G01L 9/0042 257/417 |
| 5,850,042 | A * | 12/1998 | Warren | G01P 15/0802 73/514.21 |
| 5,914,801 | A * | 6/1999 | Dhuler | B81B 3/0051 359/198.1 |
| 6,215,137 | B1 * | 4/2001 | Suzuki | B82Y 35/00 257/253 |
| 6,433,401 | B1 * | 8/2002 | Clark | B81C 1/00246 257/510 |
| 7,019,231 | B2 * | 3/2006 | Ishikawa | B81B 3/0051 200/61.45 R |
| 7,280,014 | B2 * | 10/2007 | Potter | H01H 59/0009 200/181 |
| 8,049,287 | B2 | 11/2011 | Combi et al. | |
| 8,304,275 | B2 | 11/2012 | Schlarmann et al. | |
| 8,648,432 | B2 | 2/2014 | Haeusler | |
| 2005/0172717 | A1 | 8/2005 | Wu et al. | |
| 2008/0016683 | A1 | 1/2008 | Brida et al. | |
| 2008/0290430 | A1 | 11/2008 | Mahadevan et al. | |
| 2010/0019393 | A1 | 1/2010 | Hsieh et al. | |
| 2010/0315938 | A1 | 12/2010 | Ascanio et al. | |
| 2013/0214365 | A1 | 8/2013 | Schlarmann et al. | |
| 2014/0252512 | A1 | 9/2014 | Yang et al. | |
| 2015/0115387 | A1 * | 4/2015 | Buckley | H01L 25/167 257/443 |
| 2016/0051131 | A1 * | 2/2016 | Jeong | G02B 26/101 600/478 |
| 2016/0096724 | A1 | 4/2016 | Dawson et al. | |
| 2016/0159642 | A1 | 6/2016 | Hooper et al. | |

OTHER PUBLICATIONS

Office Action, U.S. Appl. No. 14/506,037, filed Jan. 21, 2016.
Office Action, U.S. Appl. No. 14/564,340, filed Feb. 19, 2016.

* cited by examiner

*Primary Examiner* — Thanh V Pham
(74) *Attorney, Agent, or Firm* — Charlene R. Jacobsen

(57) ABSTRACT

A microelectromechanical systems (MEMS) die includes a substrate having a first substrate layer, a second substrate layer, and an insulator layer interposed between the first and second substrate layers. A structure is formed in the first substrate layer and includes a platform upon which a MEMS device resides. Fabrication methodology entails forming the MEMS device on a front side of the first substrate layer of the substrate, forming openings extending through the second substrate layer from a back side of the second substrate layer to the insulator layer, and forming a trench in the first substrate layer extending from the front side to the insulator layer. The trench is laterally offset from the openings. The trench surrounds the MEMS device to produce the structure in the first substrate layer on which the MEMS device resides. The insulator layer is removed underlying the structure to suspend the structure.

17 Claims, 5 Drawing Sheets

METHOD OF MAKING A MEMS DIE HAVING A MEMS DEVICE ON A SUSPENDED STRUCTURE

TECHNICAL FIELD OF THE INVENTION

The present invention relates generally to microelectromechanical systems (MEMS) devices. More specifically, the present invention relates to methodology for fabricating a suspended MEMS device with improved stress isolation.

BACKGROUND OF THE INVENTION

Microelectromechanical systems (MEMS) devices are semiconductor devices with embedded mechanical components. MEMS devices include, for example, pressure sensors, accelerometers, gyroscopes, microphones, digital mirror displays, micro fluidic devices, and so forth. MEMS devices are used in a variety of products such as automobile airbag systems, control applications in automobiles, navigation, display systems, inkjet cartridges, and so forth.

There are significant challenges to be surmounted in the packaging of MEMS devices due at least in part to the necessity for the MEMS devices to interact with the outside environment, the fragility of many types of MEMS devices, and severe cost constraints. Indeed, many MEMS device applications require smaller size and low cost packaging to meet aggressive cost targets. The packaging of MEMS sensor applications often uses materials with dissimilar coefficients of thermal expansion. As such, a high thermally induced stress can develop during MEMS device manufacture or operation. These thermal stresses, as well as stresses due to moisture and assembly processes, can result in deformation of the underlying substrate, referred to herein as package stress. Variations in package stress can cause instability of the MEMS device and output shifts in the MEMS device.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

DETAILED DESCRIPTION

As the uses for microelectromechanical systems (MEMS) devices continue to grow and diversify, increasing emphasis is being placed on smaller size and low cost packaging without sacrificing part performance. Embodiments entail a MEMS die and a method of fabricating a MEMS die for improved stress isolation. In particular, a MEMS device is created on a multi-layered substrate, such as a silicon-on-insulator (SOI) substrate. The multi-layered substrate is suitably processed through the execution of relatively simple methodology to produce a suspended cantilevered platform structure upon which the MEMS device resides. Such a configuration enables isolation of the MEMS device from outside stresses, such as packaging and/or thermal stresses.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued. It is should be understood that the use of relational terms, if any, such as first and second, top and bottom, and the like are used solely to distinguish one from another entity or action without necessarily requiring or implying any actual such relationship or order between such entities or actions.

Figure 1:
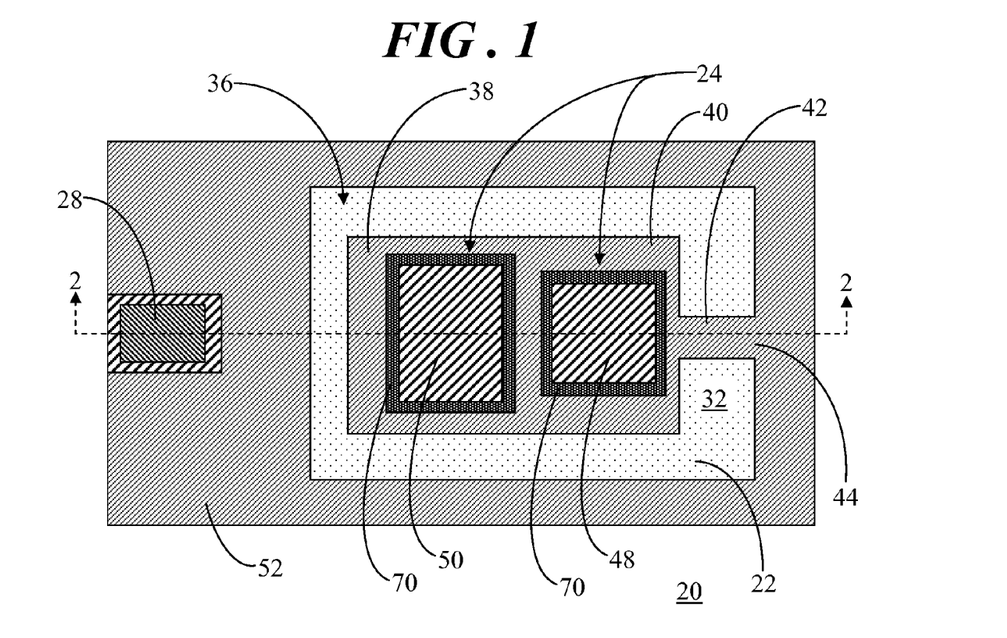
FIG. 1 shows a top view of a microelectromechanical systems (MEMS) die in accordance with an embodiment.
Figure 2:
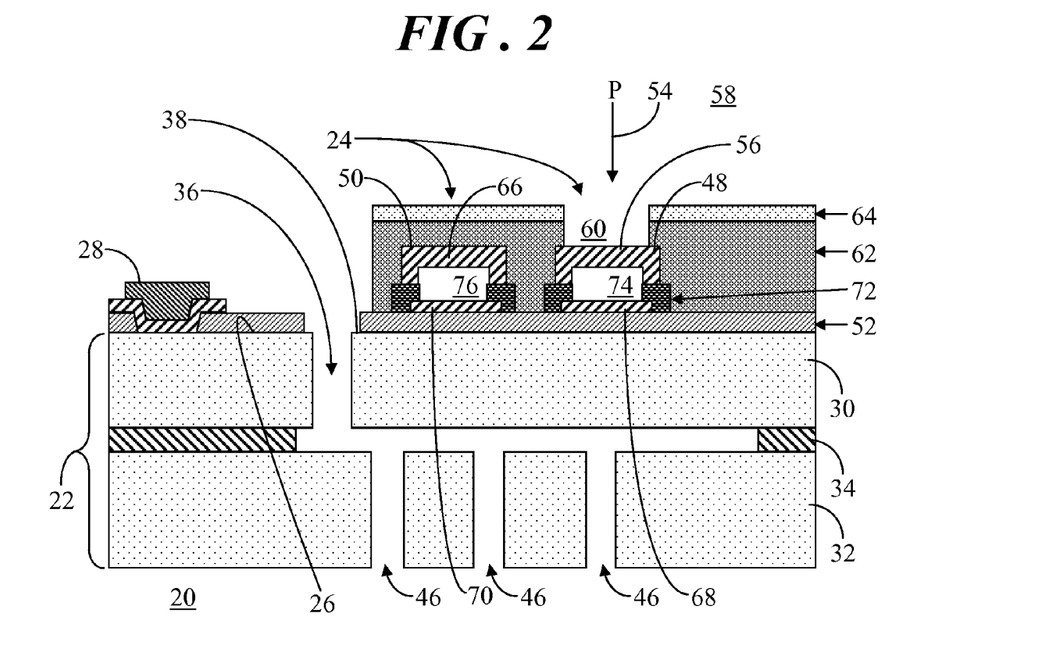
FIG. 2 shows a side sectional view of the MEMS die taken along section lines 2-2 of FIG. 1.

Referring now to FIGS. 1-2, FIG. 1 shows a top view of a microelectromechanical systems (MEMS) die 20 in accordance with an embodiment, and FIG. 2 shows a side sectional view of MEMS die 20. As will be discussed in greater detail below, the top view of FIG. 1 is presented with certain material layers removed so as to visualize the underlying structural elements of MEMS die 20. FIG. 1 and subsequent FIGS. 2 and 4-9 are illustrated using various shading and/or hatching to distinguish the various elements from one another for clarity of illustration. These different elements within the structural layers may be produced utilizing current and upcoming micromachining techniques of depositing, patterning, etching, and so forth.

MEMS die 20 generally includes a substrate 22 and a MEMS device 24 formed on a front side 26 of substrate 22. MEMS die further includes bond pads 28 formed on front side 26 of substrate 22. Bond pads 28 (one shown) may be utilized to electrically connect MEMS device 24 to external components such as an integrated circuit die, not shown herein for simplicity. As such, conductive traces (not shown) can be formed on front side of substrate 22 to suitably electrically couple MEMS device 24 with bond pads 28. Only a single bond pad 28 and no conductive traces are shown for simplicity of illustration. Those skilled in the art will recognize that MEMS die 20 may include any number of bond pads and the interconnecting conductive traces in accordance with a particular design configuration. Such details will not be explained in any greater extent than that considered necessary for the understanding and appreciation of the underlying concepts of the examples set forth herein and in order not to obscure or distract from the teachings herein.

In accordance with an embodiment, substrate 22 is a silicon-on-insulator (SOI) substrate. SOI technology refers to the use of a layered silicon-insulator-silicon substrate in place of conventional substrates in semiconductor manufacturing. SOI-based devices differ from conventional silicon-built devices in that the silicon junction is above an electrical insulator, typically silicon dioxide. Thus, SOI substrate 22 includes a first substrate layer 30, a second substrate layer 32, and an insulator layer 34 interposed between first and second substrate layers 30, 32. As such, front side 26 of MEMS die 20 at which MEMS device 24 is formed is at the top surface of first substrate layer 30. Although SOI technology is generally described herein, alternative technologies and materials may be implemented to produce the substrate layers 30, 32 with an intervening layer 34 that will be utilized as a sacrificial layer.

A trench 36 extends through first substrate layer 30 to form a structure 38 in first substrate layer 30. Structure 38 includes a platform 40 at which MEMS device 24 resides and a coupling member, referred to herein as an arm 42. Arm 42 extends from platform 40 and couples platform 40 to a portion 44 of first substrate layer 30. Openings 46 extend through second substrate layer 32 underlying structure 38, and insulator layer 34 underlying structure 38 is removed. After trench 36 is formed surrounding structure 38 and insulator layer 34 is removed under structure 38, platform 40 and arm 42 are suspended over second substrate layer 32 with arm 42 being the sole attachment point of structure 38 to the surrounding first substrate layer 30. Thus, structure 38 is cantilevered from portion 44 of first substrate layer 30 and is thus referred to hereinafter as a cantilevered platform structure 38. Cantilevered platform structure 38 is formed in first substrate layer 30 and is suspended over second substrate layer 32 due to the absence of insulator layer 34 underlying cantilevered platform structure 38.

Insulator layer 34 can be removed utilizing an etch process, as will be discussed in greater detail below. The etchant can be introduced to insulator layer 34 via trench 36 extending through first substrate layer 30 and via openings 46 in second substrate layer 32 underlying structure 38. In accordance with an embodiment, the locations of openings 46 are laterally offset from (i.e., not in a straight line with) trench 36 to avoid possible breakage of the relatively thin insulator layer 34. Additionally, openings 46 are significantly smaller than trench 36 in order to enable entry of the etchant through openings 46 without unduly weakening second substrate layer 32.

In the illustrated example, MEMS device 24 includes a pressure sensor. MEMS pressure sensor device 24 generally includes one or more sense cells 48 (one shown) and one or more reference cells 50 (one shown) residing on platform 40. Sense cell 48 is sensitive to ambient pressure 54, represented by an arrow and labeled "P" in FIG. 2. That is, a membrane element, also referred to as a diaphragm 56, of sense cell 48 is exposed to an external environment 58 via an opening 60 extending through protective dielectric material, such as a tetraethyl orthosilicate (TEOS) layer 62 and a silicon oxynitride (SiON) layer 64. It should be noted that TEOS layer 62 and SiON layer 64 are not shown in FIG. 1 in order to better visualize the underlying sense and reference cells 48, 50. Unlike sense cell 48, reference cell 50 is largely insensitive to ambient pressure 54. By way of example, an opening does not extend through layers 62, 64 to diaphragms (one shown) 66 of reference cell 50 so that a diaphragm 66 of reference cell is embedded in TEOS layer 62.

One or more sense electrodes 68 (one shown) associated with sense cells 48 are formed in or on insulating layer 52. Similarly, one or more reference electrodes 70 (one shown) associated with reference cells 50 are formed in or on insulating layer 52. An insulating nitride layer 72 electrically isolates electrodes 68, 70 from their corresponding diaphragms 56, 66. Diaphragm 56 is spaced apart from sense electrode 68 to form a sense cavity 74 for sense cells 48. Likewise, diaphragm 66 is spaced apart from reference electrode 70 to form a reference cavity 76 for reference cells 50. Cavities 74 and 76 may be vacuum chambers or chambers filled with a suitable gas at a given controlled pressure.

In general, diaphragm 56 is exposed to external environment 58 via opening 60 and deflects in response to ambient pressure 54. In some configurations, a change in the distance between diaphragm 56 and the underlying sense electrode 68 creates a variable capacitor to detect strain (or deflection) due to the applied ambient pressure 54. Of course, diaphragm 66 is largely impervious to deflection due to ambient pressure 54 since it is embedded in TEOS layer 62. Therefore, a capacitance between diaphragm 66 and the underlying reference 70 should remain substantially constant. The difference between the two capacitances is largely indicative of a magnitude of ambient pressure 54.

The illustrated configuration yields MEMS device 24 formed on cantilevered platform structure 38 that is suspended over the underlying second substrate layer 32. Moreover, cantilevered platform structure 38 merely extends through the thickness of first substrate layer 30, instead of extending through the bulk, i.e., the entirety, of substrate 22. This cantilevered platform structure 38 can achieve the benefits of improved package stress isolation, improved device performance, and a simplified package which reduces package costs. Such a cantilevered platform structure 38 upon which a MEMS pressure sensor resides particularly enables isolation of the MEMS pressure sensor from outside stresses, such as packaging and/or thermal stresses, that could otherwise cause instability of the MEMS pressure sensor and output shifts in the MEMS pressure sensor. Although a MEMS pressure sensor is described herein, it should be understood that any of a plurality of devices may be formed on cantilevered platform structure 38 whose performance can be improved by isolating them from package stress.

Figure 3:
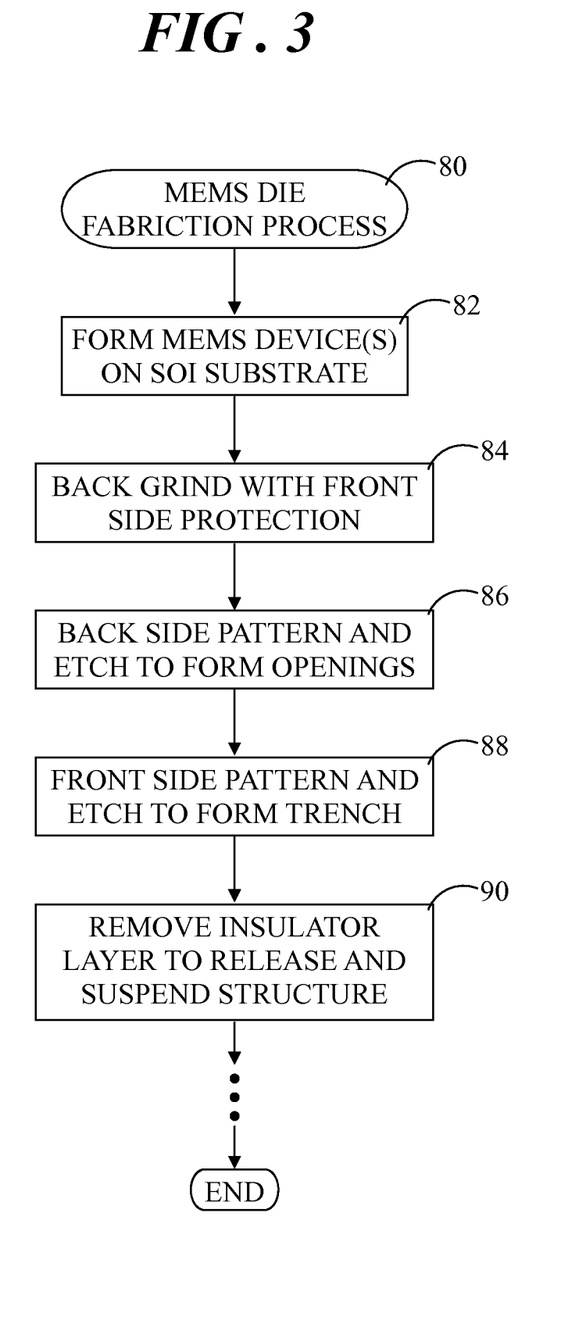
FIG. 3 shows a flowchart of a MEMS die fabrication process for producing the MEMS die of FIGS. 1 and 2 in accordance with another embodiment.

Now referring to FIG. 3, FIG. 3 shows a flowchart of a MEMS die fabrication process 80 for producing MEMS die 20 (FIGS. 1-2) in accordance with another embodiment. More specifically, the flowchart of FIG. 3 illustrates a particular method for producing MEMS die 20 having cantilevered platform structure 38. The methodology of FIG. 3 is described in connection with the fabrication of a single MEMS die 20 for simplicity of illustration. However, it should be apparent to those skilled in the art that the ensuing methodology may be executed to concurrently fabricate a plurality of MEMS dies 20 in accordance with a wafer level fabrication process.

In a block 82 of MEMS die fabrication process 80, MEMS device 24 is formed on SOI substrate 22. In a block 84, a back side grind process is performed on substrate 22 to thin second substrate layer 32 in accordance with particular design requirements. During the back side grind process, the front side, i.e., the side of MEMS die 20 upon which MEMS device 24 is formed is protected. In a block 86, a back side pattern and etch process is performed to form openings 46 (FIG. 2) extending through second substrate layer 32. In a block 88, a front side pattern and etch process is performed to form trench 36 extending through first substrate layer 30. After openings 46 and trench 36 are formed in accordance with blocks 86 and 88, insulator layer 34 (FIG. 1) is removed at a block 90 in order to release and suspend cantilevered platform structure 38. Ellipses following block 90 represent additional operations that may ensue during the execution of MEMS die fabrication process 80.

These additional operations may include, for example, wafer level testing, singulation of the wafer structure of the first and second substrate layers having a plurality of cantilevered platform structures and MEMS devices formed thereon, attachment of a lid, wirebonding with an application specific integrated circuit, overmolding, and so forth. These additional operations are not described herein for brevity.

Figure 4:
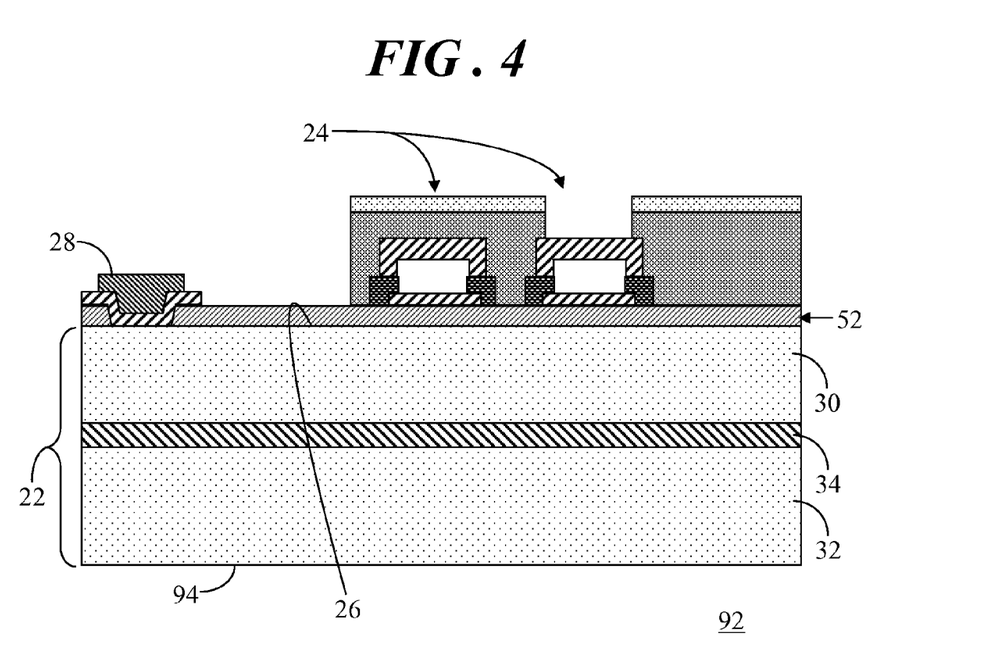
FIG. 4 shows a side sectional view of a structure at an initial stage of processing in accordance with the process of FIG. 3.

Referring to FIG. 4 in connection with MEMS die fabrication process 80 (FIG. 3), FIG. 4 shows a side sectional view of a structure at an initial stage 92 of processing. In accordance with block 82 of MEMS die fabrication process 80, MEMS device 24, bond pads 28, and conductive traces (not shown) are formed utilizing, for example, a surface micromachining technique in which MEMS device 24, bond pads 28, and the conductive traces are built by deposition and etching of various structural layers on top of substrate 22. Thereafter, a back side 94 of second substrate layer 32 may be thinned to a suitable thickness using a back grinding process with front side protection in accordance with block 84 of MEMS die fabrication process 80.

Figure 5:
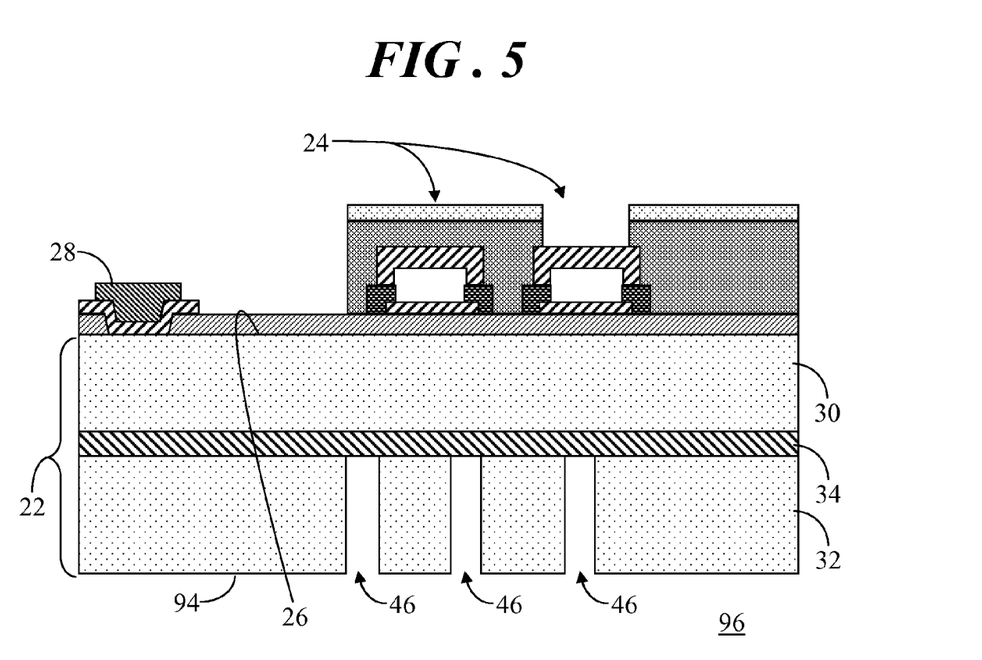
FIG. 5 shows a side sectional view of the structure of FIG. 4 at a subsequent stage of processing.

Now referring to FIG. 5 in connection with MEMS die fabrication process 80 (FIG. 3), FIG. 5 shows a side sectional view of the structure of FIG. 4 at a subsequent stage 96 of processing. In accordance with block 86 of MEMS die fabrication process 80, openings 46 are formed extending through second substrate layer 32 from back side 94 of second substrate layer 32 to insulator layer 34. Openings 46 may be formed using any of a number of known and upcoming etching processes, such as a Deep Reactive Ion Etch (DRIE) technique, a Potassium Hydroxide (KOH) etch technique, or any suitable technique. As shown, the formation of openings 46 does not remove the overlying insulator layer 34.

Figure 6:
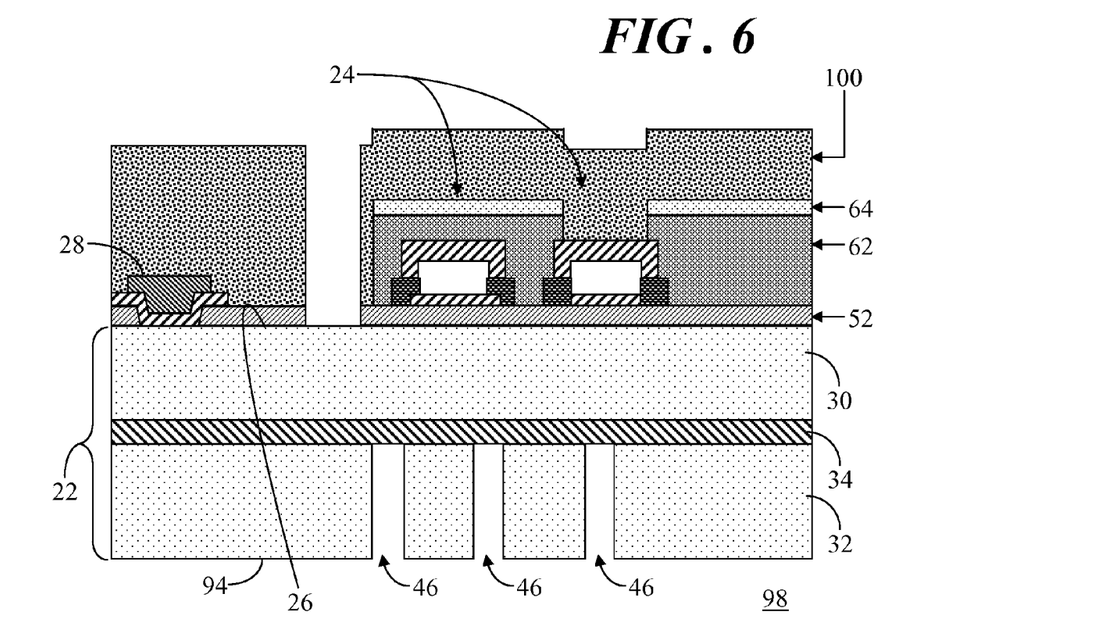
FIG. 6 shows a side sectional view of the structure of FIG. 5 at a subsequent stage of processing.
Figure 7:
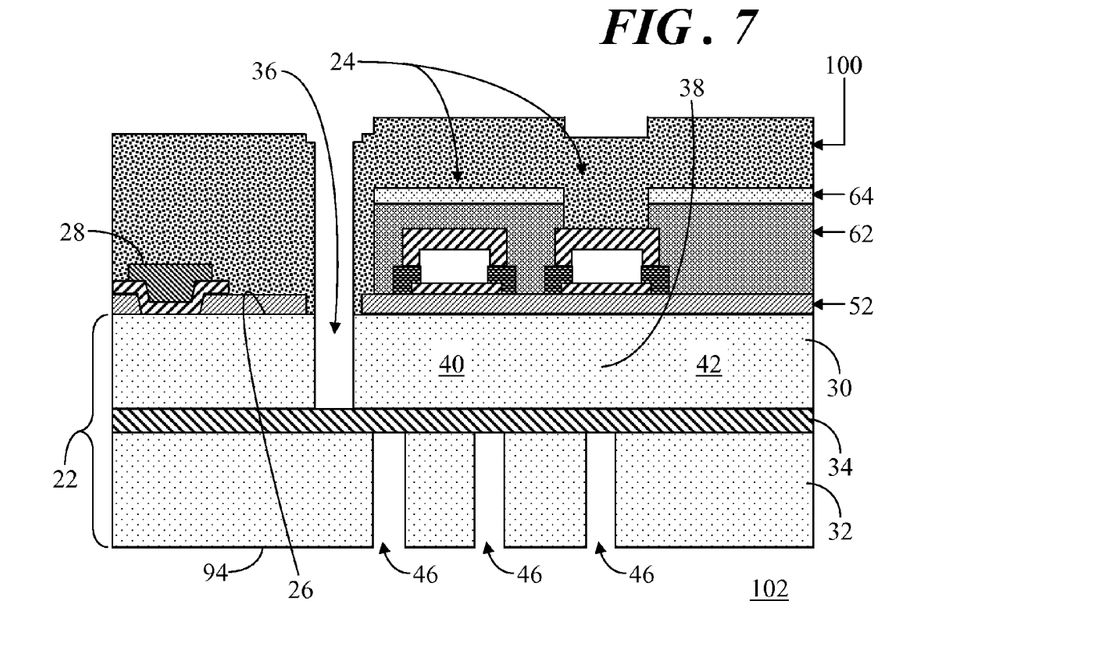
FIG. 7 shows a side sectional view of the structure of FIG. 6 at a subsequent stage of processing.

Referring to FIGS. 6 and 7 in connection with MEMS die fabrication process 80 (FIG. 3), FIG. 6 shows a side sectional view of the structure of FIG. 5 at a subsequent stage 98 of processing and FIG. 7 shows a side sectional view of the structure of FIG. 6 at a subsequent stage 102 of processing. In accordance with block 88 of MEMS die fabrication process 80, trench 36 is formed extending from front side 26 of first substrate layer 30 to insulator layer 34.

In FIG. 6, a mask layer 100 of, for example, photoresist, may be deposited over front side 26 of first substrate layer 30 and the structures (e.g., MEMS device 24, bond pads 28, and the conductive traces). The photoresist mask layer 100 may be applied at a thickness that will allow for sufficient remaining photoresist mask layer 100 during all etching operations of blocks 88 and 90 of MEMS die fabrication process 80. Following deposition of photoresist mask layer 100, an initial etch process may performed to remove insulating layer 52 from those locations where trench 36 is to be formed thereby exposing first substrate layer 30.

In FIG. 7, another etch process may be performed to form trench 36 extending through first substrate layer 30 in accordance with block 88 of MEMS die fabrication process 80. Trench 36 may be formed using any of a number of known and upcoming etching processes, such as a Deep Reactive Ion Etch (DRIE) technique, a Potassium Hydroxide (KOH) etch technique, or any suitable technique. The etching process removes the entire thickness of first substrate layer 30 from front side 26 to insulator layer 34 around a perimeter demarcating platform 40 and arm 42 in order to form structure 38. However, the formation of trench 36 does not remove the underlying insulator layer 34. It should be readily observed that trench 36 is laterally offset from (i.e., not in a straight line with) openings 46 to avoid the potential for breakage of the significantly thinner intervening insulator layer 34.

Figure 8:
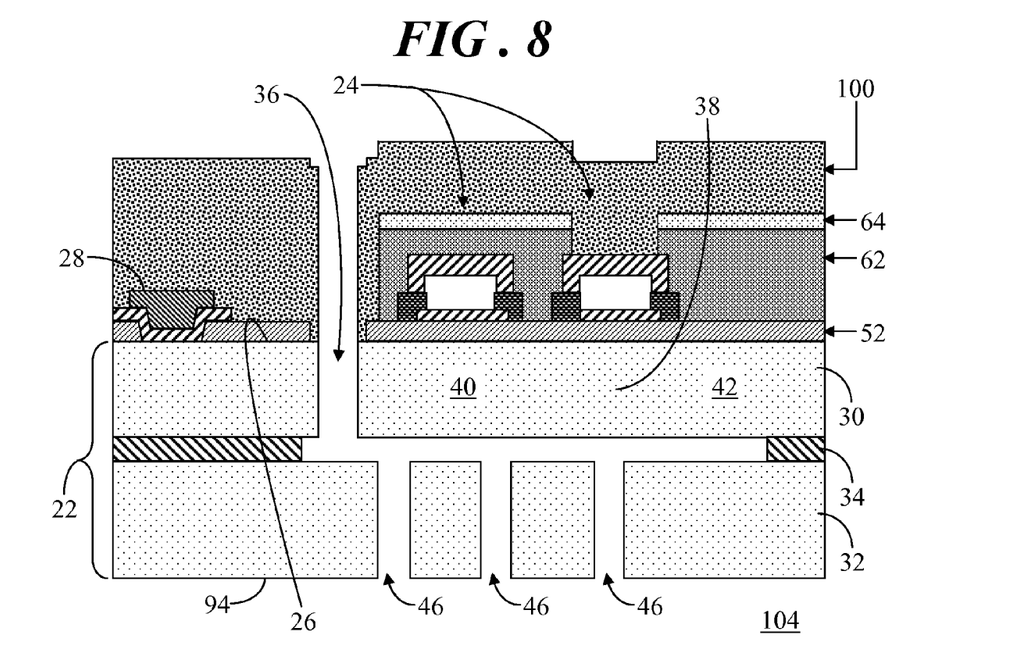
FIG. 8 shows a side sectional view of the structure of FIG. 7 at a subsequent stage of processing.

Referring to FIG. 8 in connection with MEMS die fabrication process 80 (FIG. 3), FIG. 8 shows a side sectional view of the structure of FIG. 7 at a subsequent stage 104 of processing. In accordance with block 90 of MEMS die fabrication process 80, insulator layer 34 is removed between first and second substrate layers 30, 32 in order to release and suspend cantilevered platform structure 38. The etchant may be introduced to insulator layer 34 via trench 36 and/or openings 46.

In an embodiment, insulator layer 34 is an oxide layer that can be effectively etched via a buffered oxide etch process using, for example, a hydrofluoric acid etchant. A method of hydrofluoric acid based etching, referred to as wet chemical etching, uses a liquid mixture of hydrofluoric acid and water or a liquid solution of buffered hydrofluoric acid and glycerol. The buffered hydrofluoric acid can be preferred when aluminum structures are on the substrate in order to decrease the etch rate of and resulting damage to such metals. Accordingly, photoresist mask layer 100 may remain during etching of the buffered oxide insulator layer 34 in order to protect those elements formed on front side 26 of first substrate layer 30. Thereafter, photoresist mask layer 100 can be removed.

Of concern with respect to the use of a liquid phase hydrofluoric acid etchant is the potential for stiction. In particular, the released cantilevered platform structure 38 may readily deflect (vertically or laterally) because the released structure 38 has reduced mechanical stiffness due to its suspension via arm 42. With a liquid, such as liquid phase hydrofluoric acid etchant trapped within small gaps (e.g., between the suspended cantilevered platform structure 38 and the underlying second substrate layer 32), the liquid surface tension could be strong enough to pull the suspended structure 38 over causing structure 38 to stick to the underlying second substrate layer 32 and/or to the sides of first substrate layer 30 surrounding structure 38.

Accordingly, in another embodiment, a vapor phase hydrofluoric acid etchant may be used to remove insulator layer 34 in lieu of the liquid phase hydrofluoric acid etchant. Such an approach using a vapor phase hydrofluoric acid etchant may circumvent the potential for problems associated with stiction of the suspended cantilevered platform structure 38 that could occur during removal of insulator layer 34 using a liquid phase hydrofluoric acid etchant.

Although use of a vapor phase hydrofluoric acid etchant can advantageously reduce the potential for stiction, it may disadvantageously attack the photoresist mask layer 100 and damage the underlying structures. Accordingly, in yet another embodiment, a mixed liquid phase followed by a short duration vapor phase etching approach may be implemented. That is, a liquid phase buffered hydrofluoric acid etchant may be utilized to largely remove the bulk of insulator layer 34 underlying cantilevered platform structure 38. Thereafter, photoresist mask layer 100 is removed using, for example, an oxygen plasma ash operation, a veil removal process, or any other suitable process. The resulting structure is then rinsed and dried. Next, a short duration vapor phase hydrofluoric acid etchant may be introduced to dehydrate or otherwise remove any residual liquid phase hydrofluoric acid etchant remaining under cantilevered platform structure 38. An ash operation may optionally be performed to evaporate any residues caused by the vapor phase etching operation.

A buffered oxide etch process uses a buffering agent to slow down the etch rate of hydrofluoric acid etchant making it more controllable. A pure (e.g., 49%) hydrofluoric acid etchant may undercut photoresist mask layer 100 causing it to lift off. Therefore, in still another embodiment, a sacrificial etch process typically used for phosphosilicate glass (PSG) etch may be used to remove insulator layer 34. A sacrificial etchant is typically composed of approximately 5% hydrofluoric acid and glacial acetic acid. In such a scenario, nitride material may be used for mask layer 100 in lieu of photoresist because acetic acid will dissolve photoresist masking layer.

Figure 9:
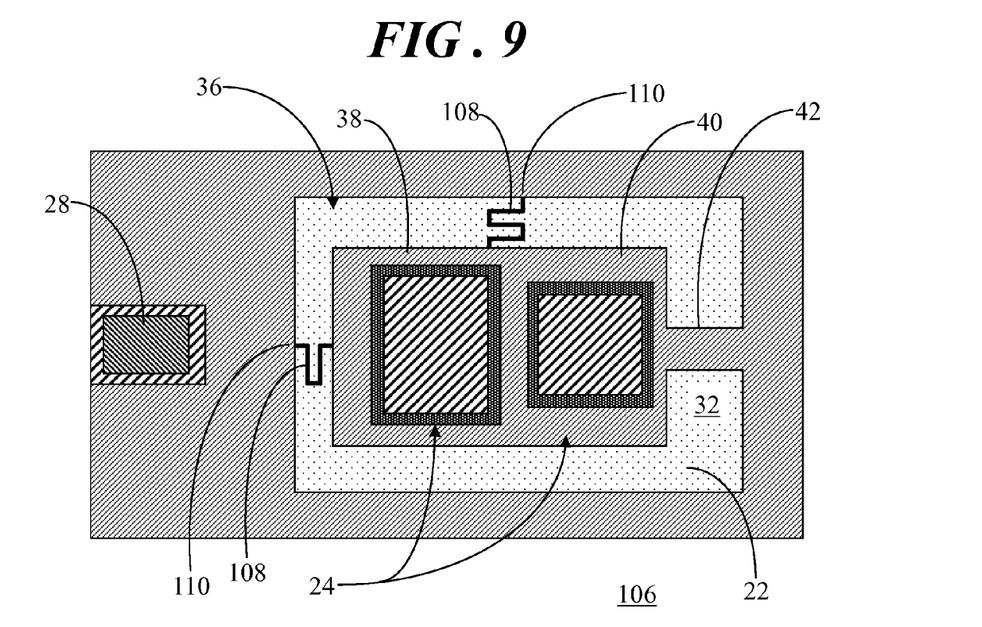
FIG. 9 shows a top view of a MEMS die in accordance with another embodiment.

Now referring to FIG. 9, FIG. 9 shows a top view of a MEMS die 106 in accordance with another embodiment. MEMS die 106 has a number of features similar to those described in detail in connection with MEMS die 20. These features include cantilevered platform structure 38 surrounded by trench 36, MEMS device 24 residing on cantilevered platform structure 38, bond pads 28 (one shown), and openings 46 (not visible) extending through second substrate layer 32 of substrate 22. MEMS die 106 further includes coupling members in the form of compliant members 108 interconnected between platform 40 and portions 110 of first substrate layer 30 surrounding trench 36. Compliant members 108 may be readily formed during execution of the front side pattern and etch block 88 (FIG. 3) of MEMS die fabrication process 80.

Compliant members 108 may provide additional support for cantilevered platform structure 38 and/or serve to largely prevent cantilevered platform structure 38 from sticking to the surrounding side walls of first substrate layer 30. Two compliant members 108 are shown for illustrative purposes. In alternative embodiments, MEMS die 106 may include only one compliant member 108 or more than two compliant members 108. Furthermore, MEMS die 106 is shown with coupling members that include both arm 42 and compliant members 108 supporting platform 40 of cantilevered platform structure 38. In another alternative embodiment, platform 40 may be coupled to first substrate layer 30 surrounding trench 36 by only compliant members 108 in lieu of arm 42 in accordance with a particular design configuration.

Embodiments of the present invention entail a MEMS die and a method of fabricating a MEMS die for improved stress isolation. An embodiment of a method of making a MEMS die includes forming a MEMS device on a substrate, the substrate having a first substrate layer, a second substrate layer and an insulator layer interposed between the first and second substrate layers, and the MEMS device being formed on a front side the first substrate layer. The method further includes forming openings extending through the second substrate layer from a back side of the second substrate layer to the insulator layer, forming a trench in the first substrate layer extending from the front side to the insulator layer, the trench surrounding the MEMS device to produce a structure in the first substrate layer on which the MEMS device resides, and removing the insulator layer underlying the structure to suspend the structure.

An embodiment of MEMS die includes a substrate having a first substrate layer, a second substrate layer, and an insulator layer interposed between the first and second substrate layers, wherein a trench extends through the first substrate layer to produce a structure in the first substrate layer, the structure having a platform and a coupling member extending from the platform, the coupling member coupling the platform to a portion of the first substrate layer surrounding the trench, and wherein openings extend through the second substrate layer underlying the structure and the insulator layer underlying the structure is removed to suspend the structure. The MEMS die further includes a MEMS device formed on a front side of the substrate and residing on the platform.

Thus, a MEMS die is produced in which a MEMS device is created on a multi-layered substrate, such as a silicon-on-insulator (SOI) substrate. The SOI substrate is suitably processed through the execution of relatively simple methodology to produce a suspended cantilevered platform structure upon which the MEMS device resides. Such a configuration enables isolation of the MEMS device from outside stresses, such as packaging and/or thermal stresses. Accordingly, the cantilevered platform structure can achieve the benefits of improved package stress isolation for the MEMS device, improved device performance, and a simplified package which reduces package costs.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A method of making a microelectromechanical systems (MEMS) die comprising:
    forming a MEMS device on a substrate, said substrate having a first substrate layer, a second substrate layer and an insulator layer interposed between said first and second substrate layers, and said MEMS device being formed on a front side said first substrate layer;
    forming openings extending through said second substrate layer from a back side of said second substrate layer to said insulator layer;
    forming a trench in said first substrate layer extending from said front side to said insulator layer, said trench surrounding said MEMS device to produce a structure in said first substrate layer on which said MEMS device resides; and
    removing said insulator layer underlying said structure to suspend said structure.

2. The method of claim 1 further comprising utilizing a layered silicon-on-insulator (SOI) substrate as said substrate.

3. The method of claim 1 wherein said forming said trench comprises laterally offsetting said trench from said openings.

4. The method of claim 1 wherein said forming said openings and said forming said trench does not remove said insulator layer underlying said structure.

5. The method of claim 1 wherein said removing is performed following said forming said openings and said forming said trench.

6. The method of claim 1 wherein said removing operation comprises performing a buffered oxide etch process using a liquid etchant to remove said insulator layer.

7. The method of claim 6 wherein said removing operation further comprises performing a vapor phase etch process following said buffered oxide etch process.

8. The method of claim 1 wherein said removing operation comprises performing a vapor phase etch process to remove said insulator layer.

9. The method of claim 1 wherein said removing operation comprises performing a sacrificial etch process to remove said insulator layer.

10. The method of claim 1 wherein said forming said trench produces said structure having a platform and a coupling member extending from said platform, said coupling member coupling said platform to a portion of said first substrate layer surrounding said trench.

11. The method of claim 10 wherein said coupling member is a sole attachment point of said platform to said portion of said first substrate layer.

12. The method of claim 10 wherein said coupling member comprises at least one compliant member interconnected between said platform and said portion of said first substrate layer surrounding said trench.

13. A method of making a microelectromechanical systems (MEMS) die comprising:
  forming a MEMS device on a silicon-on-insulator (SOI) substrate, said SOI substrate having a first silicon layer, a second silicon layer and an insulator layer interposed between said first and second silicon layers, and said MEMS device being formed on a front side said first silicon layer;
  forming openings extending through said second silicon layer from a back side of said second silicon layer to said insulator layer;
  forming a trench in said first silicon layer extending from said front side to said insulator layer, said trench being laterally offset from said openings, and said trench surrounding said MEMS device to produce a structure in said first silicon layer on which said MEMS device resides; and
  removing said insulator layer underlying said structure to suspend said structure.

14. The method of claim 13 wherein said forming said openings and said forming said trench does not remove said insulator layer underlying said structure, and said removing is performed following said forming said openings and said forming said trench.

15. The method of claim 13 wherein said forming said trench produces said structure having a platform and a coupling member extending from said platform, said coupling member coupling said platform to a portion of said first silicon layer surrounding said trench.

16. The method of claim 15 wherein said coupling member is a sole attachment point of said platform to said portion of said first substrate layer.

17. The method of claim 15 wherein said coupling member comprises at least one compliant member interconnected between said platform and said portion of said first substrate layer surrounding said trench.

* * * * *